United States Patent [19]

Matsutani

[11] Patent Number: 5,175,119
[45] Date of Patent: Dec. 29, 1992

[54] METHOD OF PRODUCING INSULATED-GATE FIELD EFFECT TRANSISTOR

[75] Inventor: Takeshi Matsutani, Machida, Japan
[73] Assignee: Fujitsu Limited, Kanagawa, Japan
[21] Appl. No.: 670,806
[22] Filed: Mar. 18, 1991
[30] Foreign Application Priority Data
Mar. 19, 1990 [JP] Japan .................. 2-67330
[51] Int. Cl.[5] .......................................... H01L 21/265
[52] U.S. Cl. ..................... 437/43; 437/41;
437/44; 437/89; 148/DIG. 82
[58] Field of Search ............... 437/44, 45, 43, 89,
437/40, 913; 148/DIG. 82, DIG. 122

[56] References Cited

U.S. PATENT DOCUMENTS

| | | | |
|---|---|---|---|
| 4,744,859 | 5/1988 | Hu et al. | 437/154 |
| 4,943,537 | 7/1990 | Harrington, III | 437/44 |
| 4,963,504 | 10/1990 | Huang | 437/41 |
| 4,978,626 | 12/1990 | Poon et al. | 437/41 |
| 4,984,042 | 1/1991 | Pfiester et al. | 357/23.9 |
| 4,988,632 | 1/1991 | Pfiester | 437/31 |
| 5,015,599 | 5/1991 | Verhaar | 437/41 |
| 5,082,794 | 1/1992 | Pfiester et al. | 437/40 |

FOREIGN PATENT DOCUMENTS 0113474 5/1987 Japan .................. 437/35

Primary Examiner—Brian E. Hearn
Assistant Examiner—Tuan Nguyen
Attorney, Agent, or Firm—Nikaido, Marmelstein, Murray & Oram

[57] ABSTRACT

A polysilicon layer of approximately 500Å in thickness and a PSG layer approximately 3000Å in thickness are sequentially layered on a silicon wafer on which a gate insulating layer is formed; an opening having been formed in the PSG layer. After forming a side wall layer made of PSG of predetermined thickness in the opening, a second polysilicon layer for a leg portion of an inverse-T gate is embedded in the opening and both PSG layers are removed. Then, n⁻ impurities are doped by ion implantation by using the second polysilicon layer as a mask, forming a LDD region. Another side wall layer is formed on the second polysilicon layer, and then, the first polysilicon layer, exposed outside of the second polysilicon layer and the side wall layer, is etched. Under the side wall layer, that polysilicon layer constituting a top of the inverse-T gate remains. Ion implantation is implemented by using the second polysilicon layer and the side wall layer as masks, such that a n⁺ source and n⁺ drain are formed. Since the n⁻ impurities are doped by the ion implantation through the first polysilicon layer having an even thickness, the junction depth in the LDD region is constant. Additionally, since the thickness of the first polysilicon layer is small, the gate insulating layer reliably functions as an etch-stop in patterning the polysilicon layer.

7 Claims, 12 Drawing Sheets

METHOD OF PRODUCING INSULATED-GATE FIELD EFFECT TRANSISTOR

BACKGROUND OF THE INVENTION

The present invention relates to an improved insulated-gate field effect transistor (IGFET) having an inverse-T gate electrode and to a method of producing the same.

When a FET is made highly integrated, electric fields adjacent to the drain increase and the so called hot-carrier effect becomes likely. To prevent this phenomenon, certain methods of easing the electric field adjacent to the drain are suggested. For example, a Lightly Doped Drain (LDD) structure and another structure having a gate made overlap the drain to restrict an electric field adjacent to thereto.

As is well known, a method of delimiting channel length in a self-alignment manner is performed by doping source and drain impurities through ion implantation, using a gate electrode as a mask. Such an insulated-gate FET, has a gate electrode housing with an inverse-T section that includes a thin electrode portion overlapping both source and drain and a thick electrode portion which functions as a mask for doping source and drain impurities.

It is conventional to produce the above inverse-T gate electrode or a FET having the electrode, see The Inverse-T gate LDD (ITLDD) Transistor of T. Huang et al., *IEDM Tech. Dig.* p. 742, (1986) and The Gate-drain Overlapped LDD (GOLD) Structure in R. Izawa et al., *IEDM Tech. Dig.* p. 38, (1987). These prior art processes will now be described.

FIGS. 1 to 6 are sectional views showing the structure of an ITLDD transistor adjacent to a gate. Referring to FIG. 1, a gate insulating layer 2 made of SiO$_2$ is formed on the surface of, for example, a p-type silicon wafer 1, and then a polysilicon layer 3 and a SiO$_2$ layer 4 are formed sequentially. A resist mask 5 to mask a region of the polysilicon layer 3 constituting a leg of an inverse-T gate electrode is formed on the SiO$_2$ layer 4.

The SiO$_2$ layer 4, exposed out of the resist mask 5, is then etched so as to show the polysilicon layer 3; the polysilicon layer 3 is then etched a predetermined distance from the surface thereof. This etching leaves only the thin polysilicon layer 3 in the region which is exposed outside of the resist mask 5 as shown in FIG. 2.

After removing the resist mask 5, as shown in FIG. 3, n-type impurities are doped by ion implantation into the surface of the silicon wafer 1. In this ion implantation, a portion 3A, which has the initial thickness of the polysilicon layer 3 and constitutes a leg of an inverse-T gate, and the SiO$_2$ layer 4 prevent impurities form being doped into the silicon wafer 1 directly lying thereunder. On the other hand, impurities are doped into the silicon wafer 1 through a thinned polysilicon layer 3B in the periphery of the leg 3A of the inverse-T gate. As a result, an n$^-$ source 6 and an n$^-$ drain 7 are formed.

Subsequently, by depositing a thick SiO$_2$ layer on the surface of the silicon wafer 1 and conducting well-known etch-backing on the SiO$_2$ layer, a side wall 8 made of the above thick SiO$_2$ is formed around the leg of the inverse-T gate as shown in FIG. 4. Then, the polysilicon layer 3, exposed outside of the SiO$_2$ layer 4 and the side wall 8 is removed by etching, so that the inverse-T gate having a leg 3A and a top 3B both made of the polysilicon layer 3 is formed as shown in FIG. 5. The gate insulating layer 2 functions as an etch-stop for this etching.

Furthermore, n-type impurities are doped by ion implantation into the silicon wafer 1 by using the SiO$_2$ layer 4, the polysilicon layer 3 thereunder and the side wall 8 as masks. Thereby, an n$^+$ source 9 and an n$^+$ drain 10 are formed as shown in FIG. 6 and an IGFET having the inverse-T gate is completed. This FET has a LDD structure in which the top of the inverse-T gate and the n$^-$ regions 6 and 7 overlap.

In the above inverse-T gate FET, since the thickness of the portion 3B which is formed by thinning the polysilicon layer 3, varies over the surface of the silicon wafer 1, the junction depth of the n$^-$ source 6 and the n$^-$ drain, formed by implanting ions passing through the thinned polysilicon layer 3B, is uneven, creating differences in the characteristics of transistors fabricated on the silicon wafer 1. The thickness non-uniformity of the polysilicon layer 3B causes another problem such that some areas on the surface of the silicon wafer 1 are etched during the process for removing the unmasked polysilicon layer 3B. This is because, in the areas, the thickness of the polysilicon layer 3B is smaller than the average thickness thereof throughout the silicon wafer 1 and the gate insulating layer 2 be subject to an excessive etching condition to fail to function as an etch-stop.

FIGS. 7 to 10 are sectional views showing an IGFET having the above GOLD structure adjacent to a gate. Referring to FIG. 7, a gate insulating layer 12 made of SiO$_2$ is formed on the surface of a p-type silicon wafer 11. A first polysilicon layer 13 is deposited thereon and a natural oxide film 14 of 5 to 10 Å in thickness is formed on the surface. Then, a second polysilicon layer 15 and a SiO$_2$ layer are deposited in turn on the natural oxide film 14 and the SiO$_2$ layer is patterned, thereby forming an insulating layer 16.

As shown in FIG. 8, the polysilicon layer 15 is etched by using the insulating layer 16 as a mask. This etching is performed on a condition that the natural oxide film 14 functions as an etch-stop. Then, a n$^-$ source 17 and n$^-$ drain 18 are formed by doping n-type impurities by ion implantation into the silicon wafer 11, while using the insulating layer 16 as a mask.

Subsequently, a thick SiO$_2$ is deposited on the silicon wafer 11 and a well-known etch-backing is conducted on the SiO$_2$ layer, thereby forming a side wall 19 made of the SiO$_2$ on the sides of the polysilicon layer 15 and the insulating layer 16 as shown in FIG. 9. Then the polysilicon layer 13 exposed outside of the insulating layer 16 and the side wall 19 is removed by etching. Thus, an inverse-T gate having a leg composed of the polysilicon layer 15 and a top composed of the polysilicon layer 13 is formed.

N-type impurities are then doped by ion implantation into the silicon wafer 11 by using the insulating layer 16 and the side wall 19 as masks and an n$^+$ source 20 and an n$^+$ drain 21 are formed (FIG. 10) so that an IGFET having LDD structure, including an inverse-T gate electrode results.

In the above GOLD process, a thin insulating film such as a natural oxide film is used as an etch-stop for patterning the leg of the inverse-T gate. The insulating film disposed between these polysilicon layers 13 and 15 must be of a thickness capable of maintaining electrical conduction therebetween by the tunnel effect, the thickness being less than approximately 10 Å. However, it is inevitable that overetching take place in order to pattern the polysilicon layer 15 due to the thickness distribution of the polysilicon layer 15 on the silicon wafer 11. As a result, when the natural oxide film 14 is etched, the polysilicon layer 13 is also etched in some areas. Therefore, the junction depth of the n⁻ regions 17 and 18, which are formed by ion implantation through the polysilicon layer 13, is not uniform, creating differences in characteristics of the FET.

In the above process, an extremely high selective etching ratio is required for the natural oxide film 14 with respect to the polysilicon. Isotropic etching is typically employed to obtain a high selective etching ratio, accordingly, side etching of the polysilicon layer 15 occurs under the insulating layer 16 as shown in FIG. 8. As a result, the dimension of the inverse-T gate, especially, the size in the channel length direction is unlikely to be uniform in accordance with the thickness distribution of the polysilicon layer 15 on the silicon wafer 11, resulting in differences in the characteristics of the FET.

The present invention aims to solve the above problems of the prior art, such as ITLDD and GOLD. Therefore, a first object of the present invention is to provide a method of producing a IGFET having an inverse-T gate wherein the thickness of a top of the inverse-T gate is uniform. A second object of the present invention is to provide a method of producing a IGFET having an inverse-T gate, the method preventing the size of a leg of the inverse-T gate in the channel length direction from being uneven due to side etching in the leg. A third object of the present invention is to uniformly produce a plurality of such IGFETs on a semiconductor substrate.

SUMMARY OF THE INVENTION

A method of producing an IGFET having a LDD structure with an inverse-T gate according to the present invention comprises the steps: forming a first conductive layer constituting a top of the inverse-T gate and a masking layer having an opening corresponding to a leg of the inverse-T gate in turn on the surface of a semiconductor substrate on which a gate insulating layer has been formed; locally embedding a second conductive layer constituting the leg into the opening so as to come into contact with the first conductive layer; forming a side wall layer around the second conductive layer after removing the masking layer; etching the first conductive layer which is exposed outside of the second conductive layer and the side wall layer and thus forming an inverse-T gate; doping n⁻ source and drain impurities by using the second conductive layer as a mask before forming the side wall layer; and doping n+ source and drain impurities by using the second conductive layer and the side wall layer as masks.

DESCRIPTION OF THE PREFERRED EMBODIMENTS

The basic production process of an inverse-T gate according to the present invention will now be described.

Figure 1:
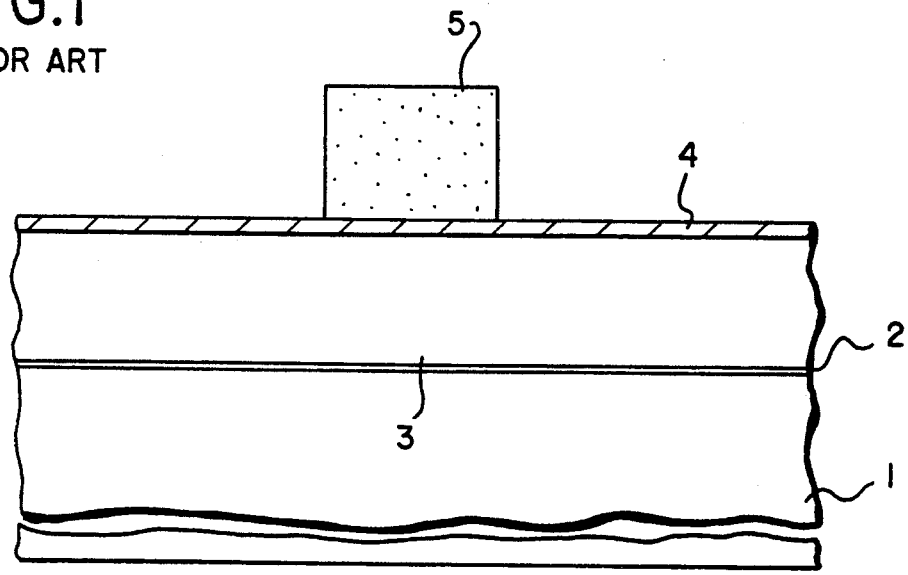
FIGS. 1 to 6 are sectional views of a main part of an ITLDD transistor in a production process according to prior art.
Figure 2:
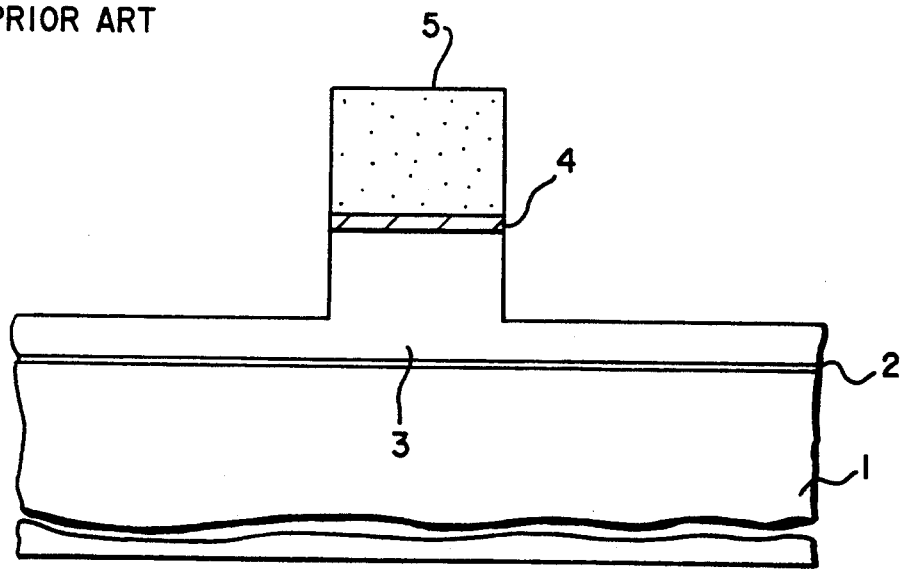
Figure 3:
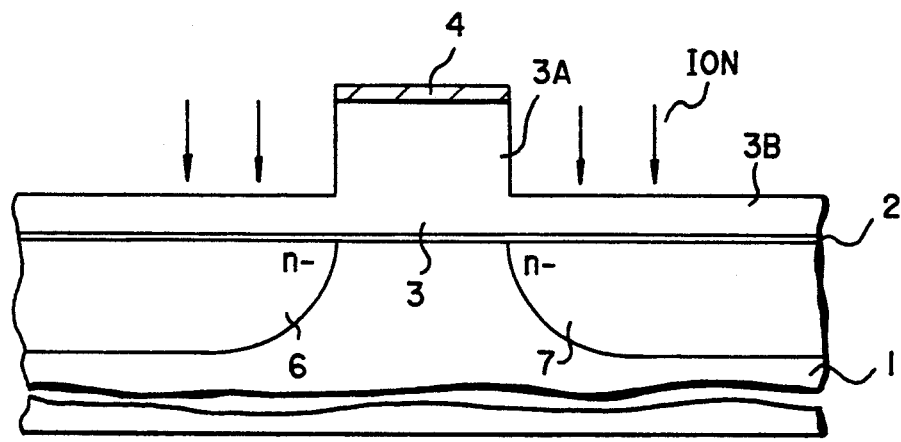
Figure 4:
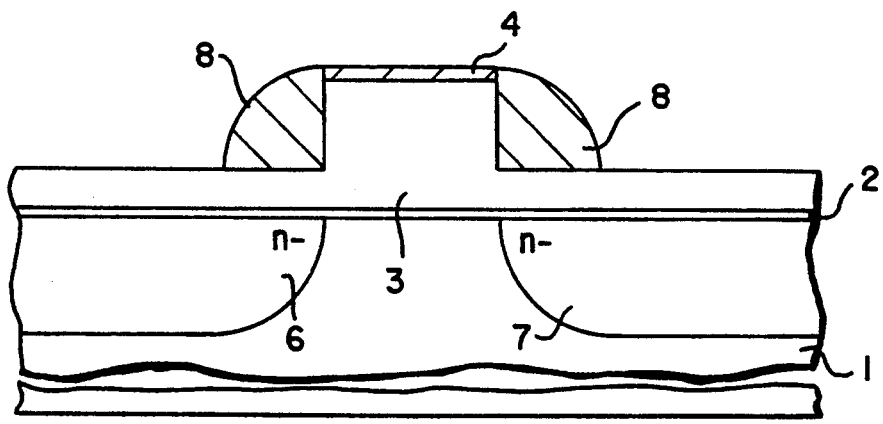
Figure 5:
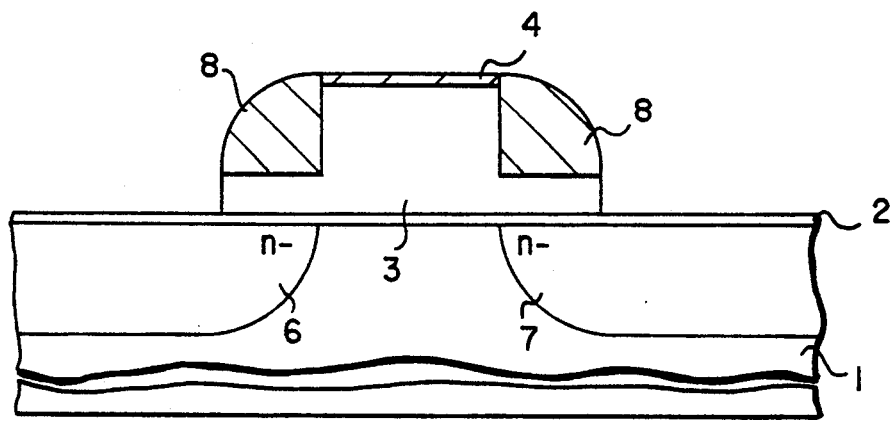
Figure 6:
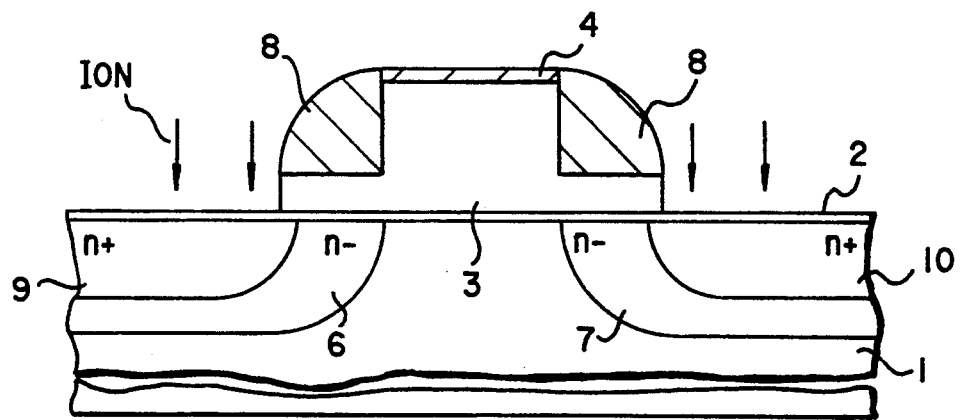
Figure 7:
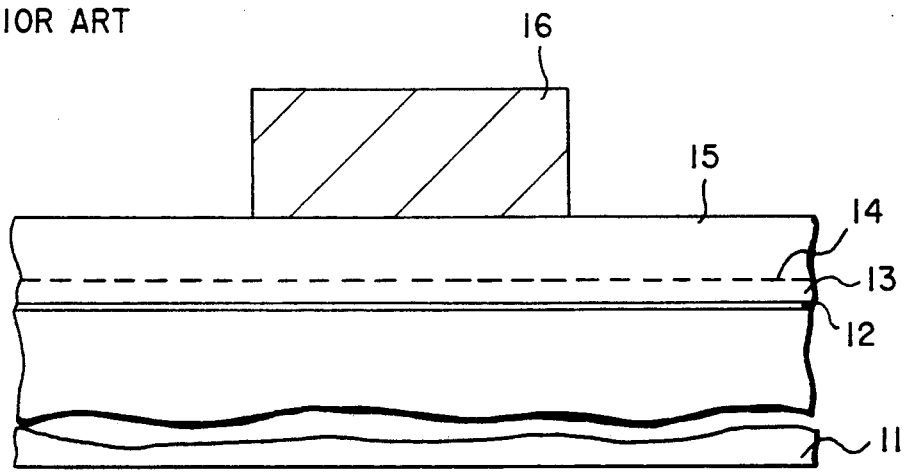
FIGS. 7 to 10 are sectional views of a main part of an inverse-T gate FET having GOLD structure in a production process according to prior art.
Figure 8:
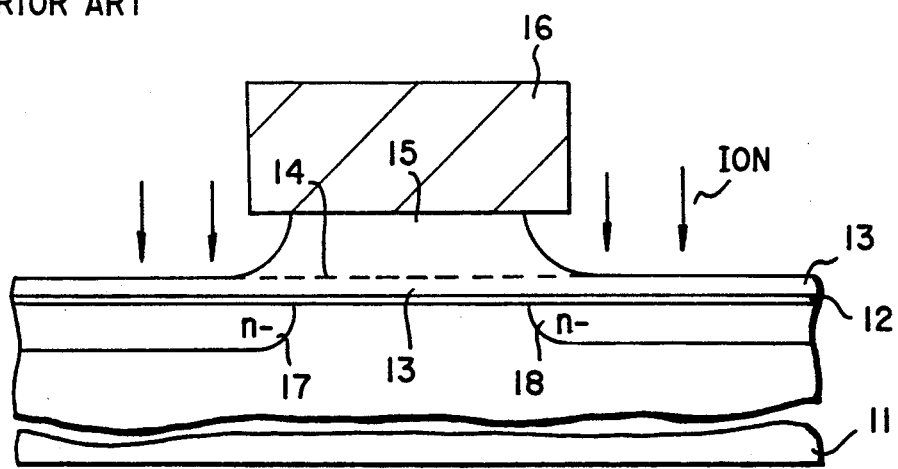
Figure 9:
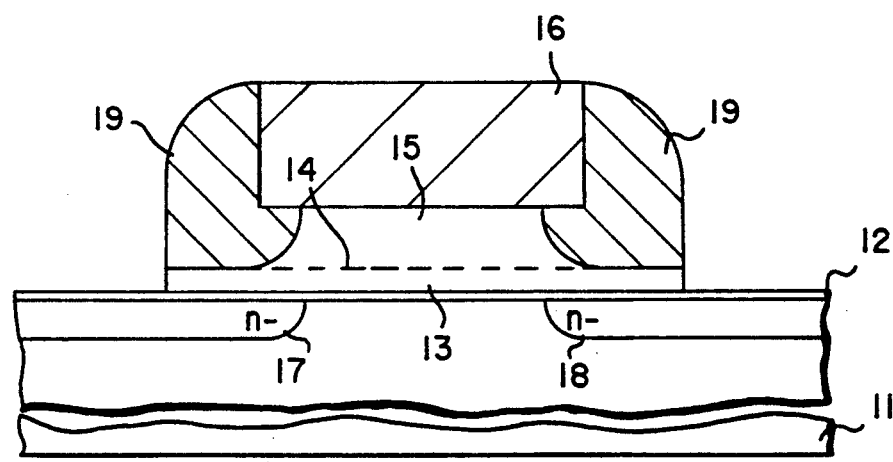
Figure 10:
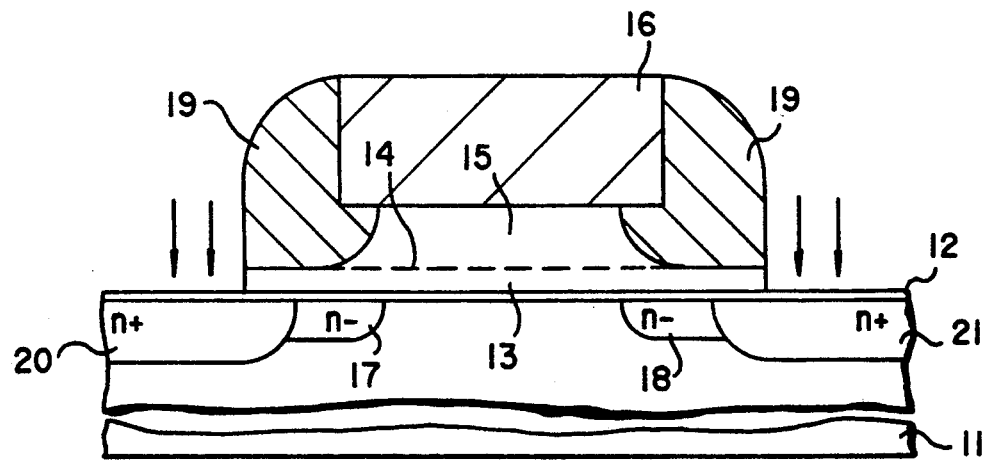
Figure 11:
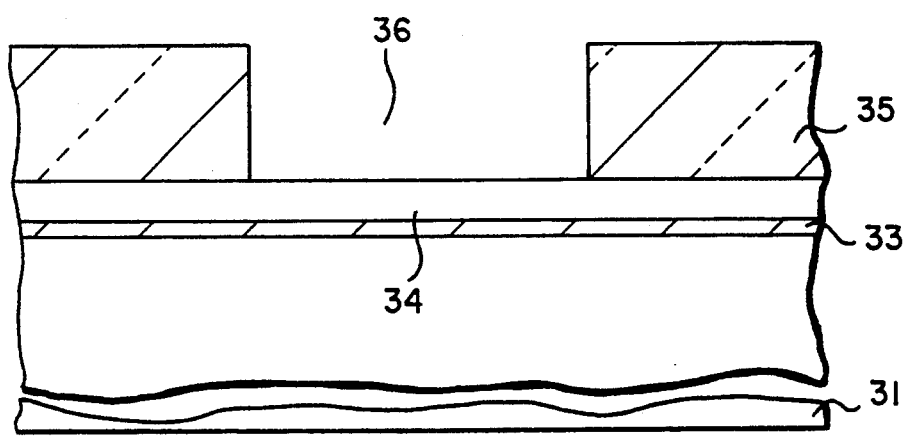
FIGS. 11 to 13 are sectional views of an inverse-T gate of the present invention in accordance with the production process thereof.

Referring to FIG. 11, after a gate insulating layer 33 of approximately 150 Å in thickness is deposited, a polysilicon layer 34 containing impurities, and a masking layer 35 made of phosphosilicate glass (PSG) are formed on, for example, a p-type silicon wafer 31 sequentially. An opening 36 for exposing the polysilicon layer 34 therethrough is formed by locally etching the masking layer 35.

Figure 12:
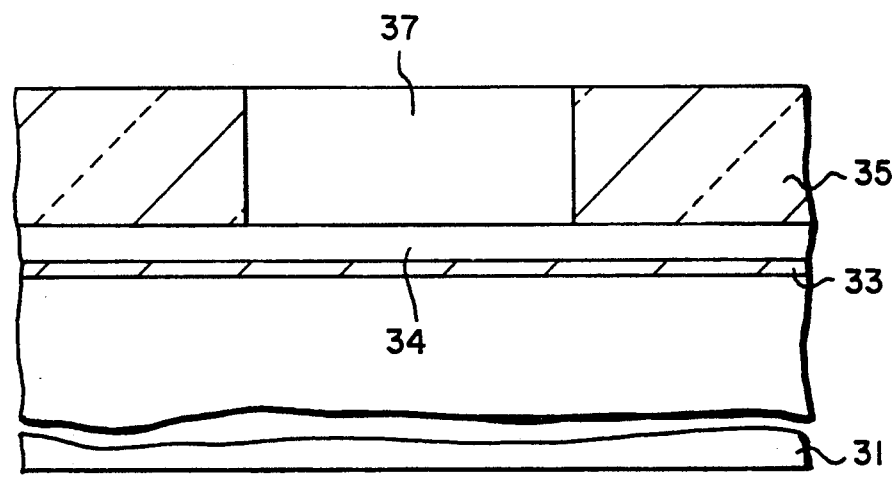

Subsequently, a polysilicon layer 37 is selectively deposited into the opening 36 as shown in FIG. 12. In order to form the polysilicon layer 37, any well-known method, such as a method of depositing polysilicon over all of the silicon wafer 31 and leaving the polysilicon only in the opening 36 by applying etch-backing to the polysilicon, a method of selecting conditions for chemical vapor deposition (CVD) so that polysilicon does not grow on an insulating layer such as the masking layer 35, but only on the polysilicon layer 34, may be used.

Figure 13:
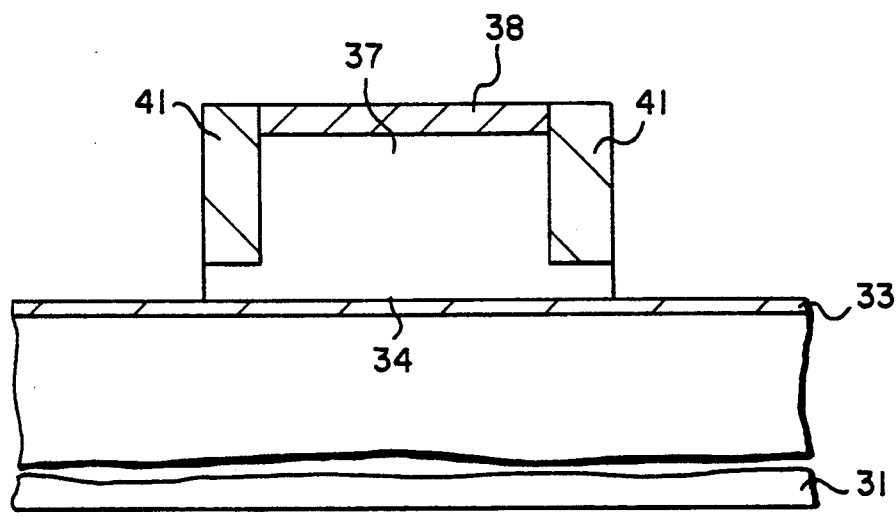

After an insulating layer 38 is, as shown in FIG. 13, formed on the surface of the polysilicon layer 37 by, for example, thermal oxidation, the masking layer 35 is selectively removed by using an etchant such as a hydrofluoric acid (HF) solution. Then, side wall layer 41 made of, for example, $SiO_2$ is formed on the side of the polysilicon layer 37. The side wall layer 41 may be formed by a well-known method which layers $SiO_2$ over all of the silicon wafer 31 and conducts etch-backing on the $SiO_2$.

The polysilicon layer 34 is etched by using the layers 38 and 41 as masks. In this etching, the gate insulating layer 33, which is sufficiently thicker than a natural oxide film, functions as an etch-stop. The insulating layer 38 is disposed to protect the polysilicon layer 37 in the above etching. If the polysilicon layer 37 has a sufficient thickness allowable for a loss thereof in the etching, it is possible to leave the polysilicon layer 37 in the above etching without the insulating layer 38.

As described above, according to the present invention, the polysilicon layer 34 constituting the top of the inverse-T gate is not etched in the process of forming the leg of the inverse-T gate. Therefore, an even thickness of the polysilicon layer 34 is maintained, thereby achieving a constant junction depth of the n⁻ source and drain during an ion implantation through the polysilicon layer 34. Furthermore, since the gate insulating layer 33 is used as an etch-stop, wide margin in overetching requirements due to the thickness distribution of the polysilicon layer 34 on the silicon wafer 31 is possible.

Figure 14:
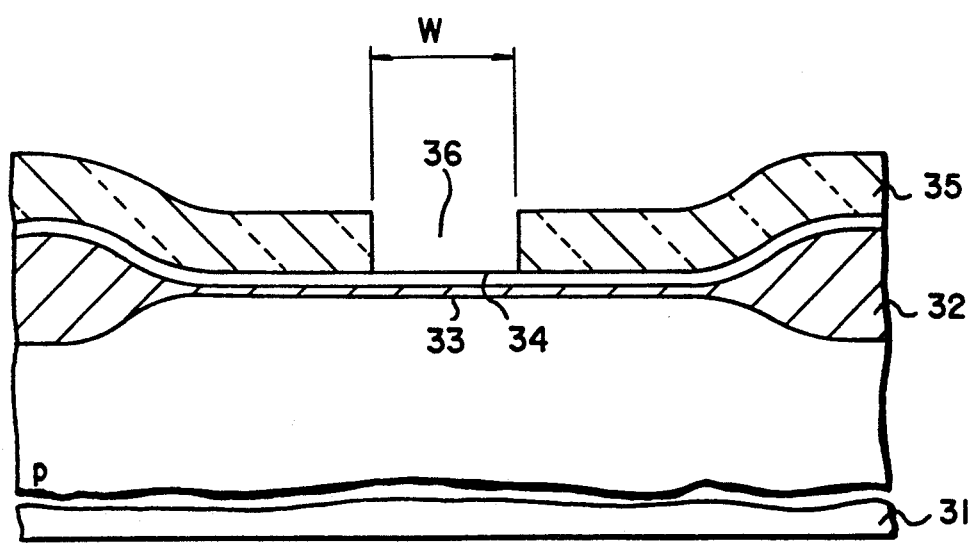
FIGS. 14 to 17 are sectional views of a main part of an IGFET having the inverse-T gate according to a first embodiment of the present invention.

A first embodiment of the present invention will now be described below. Referring to FIG. 14, a field insulating layer 32 is formed by locally and thermally oxidizing one surface of a p-type silicon wafer 31 as set forth by the LOCOS process in the well-known which uses an oxidation-resistant mask made of a silicon nitride film. After removing the above oxidation-resistant mask (not shown), the surface of the silicon wafer 31 which is exposed outside of the field insulating layer 32 is thermally oxidized so as to form a gate insulating layer 33 of approximately 80 Å in thickness. After that, a polysilicon layer 34 into which impurities are doped, and whose thickness is approximately 500 Å, is deposited on the gate insulating layer 33 by using a well-known CVD method. The impurities are arbitrarily doped during or after the CVD growth of the polysilicon layer 34. The polysilicon layer 34 may be replaced with a layer made of a refractory metal or a compound thereof.

After a PSG masking layer 35 of approximately 3000 Å in thickness is deposited on the polysilicon layer 34 by using a method such as CVD, an opening 36 is formed in the masking layer 35 by using conventional photolithography. The etching of the PSG masking layer 35 to form the opening 36 may be conducted by a known reactive ion etching (RIE) method which uses a mixed gas of, for example, $CF_4$ and $CHF_3$ as an etchant and is completed when the polysilicon layer 34 is exposed. The width W of the opening 36 in the channel length direction is, for example, 8000 Å.

Figure 15:
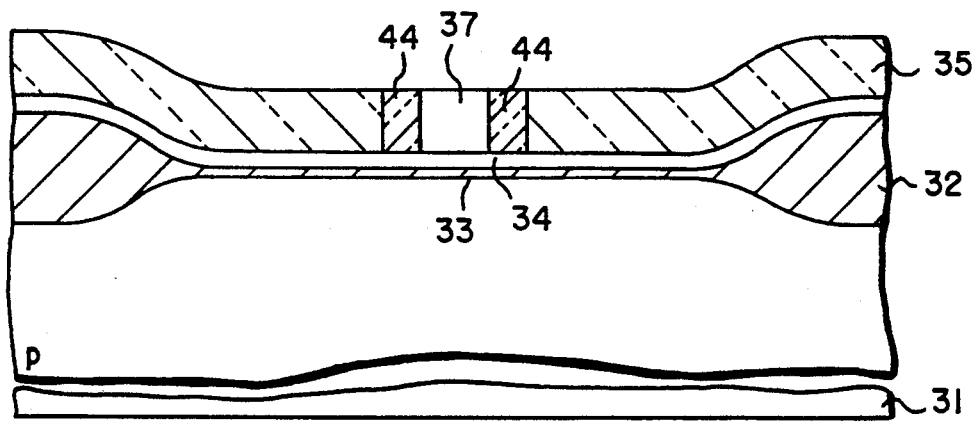

As shown in FIG. 15, side wall layer 44, made of PSG and having a thickness of approximately 2000 Å, is formed on the side of the masking layer 35 exposed in the opening 36. The side wall layer 44 may be formed by a known method which includes deposition of PSG of approximately 2500 Å in thickness on the silicon wafer 31, and the etch-backing of the PSG by using the mixed gas of $CF_4$ and $CHF_3$ as etchant. Since the side wall layer 44 is formed on the opposite sides of the masking layer 35, the width W of the opening 36 is approximately 4000 Å. This technique makes it possible to shorten the channel length of the inverse-T gate FET to less than that previously achievable utilizing existing lithography technology.

A polysilicon layer 37 into which impurities are doped is selectively embedded into the opening 36. The polysilicon layer 37 is formed by deposition of polysilicon on the silicon wafer 31, and etch-backing of the polysilicon by a RIE using a mixed gas of $CCl_4$ and $O_2$ as an etchant. Well-known selective growth methods as described above can also be used for forming the polysilicon layer 37. The etch-backing in the former process may be conducted by an isotropic plasma etching method which uses a mixed gas of $CF_4$ and $O_2$ as an etchant. Moreover, the impurities may be doped into the polysilicon layer 37 by an arbitrary method, such as the addition of the impurities to the deposition gas or the implantation of ions thereof after the growth of the polysilicon layer. The polysilicon layer 37 may be replaced with a layer made of a refractory metal and a compound thereof.

Figure 16:
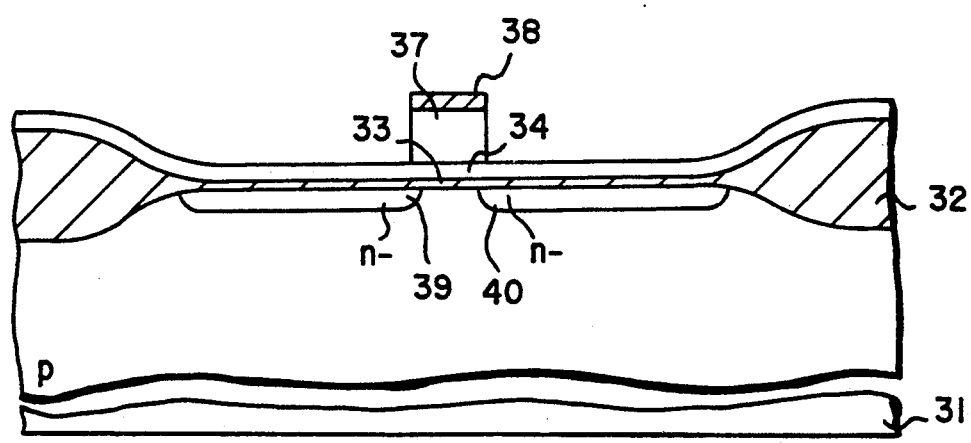

After the leg of the inverse-T gate composed of the polysilicon layer 37 is formed, the masking layer 35 and side wall layer 44, both made of PSG, are selectively removed as shown in FIG. 16. This removal is performed by wet etching which uses, for example, hydrofluoric acid (HF) solution as an etchant. Before this etching, an insulating layer 38 of approximately 1500 Å in thickness is formed on the polysilicon layer 37 by, for example, thermal oxidation.

Then, n-type impurities are doped by ion implantation into the silicon wafer 31 through the polysilicon layer 34 such that the dose of arsenic (As) ions is, for example, $5 \times 10^{14}$ cm$^{-2}$ and the accelerating energy thereof is 160 KeV. As a result, a n$^-$ source 39 and n$^-$ drain 40 are formed in the region outside of the polysilicon layer 37.

Figure 17:
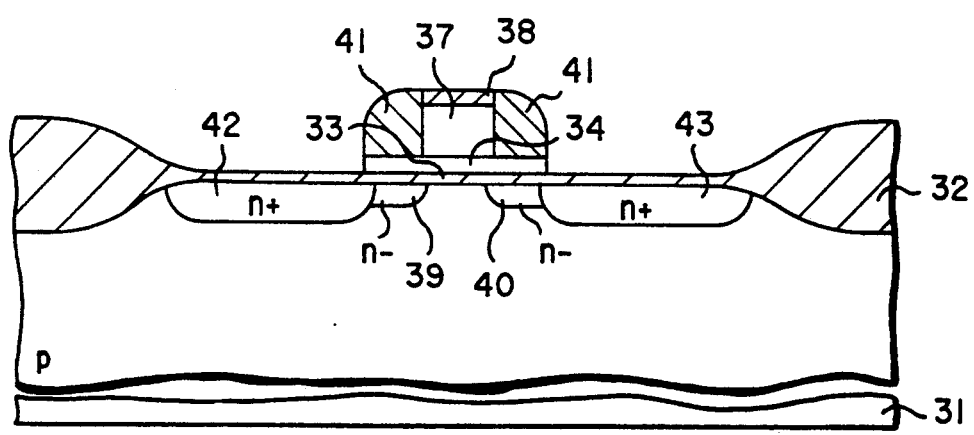

Subsequently, side wall 41 composed of, for example, $SiO_2$ is formed on the side of the polysilicon layer 37 as shown in FIG. 17. The formation may be performed by depositing $SiO_2$ on of approximately 2000 Å in thickness and conducting the etch-backing on the $SiO_2$ by a known RIE method which uses a mixed gas of $CF_4$ and $CHF_3$ as an etchant. After that, the polysilicon layer 34 is patterned by etching while using the insulating layer 38 and the side wall layer 41 as masks. Since the thickness of the polysilicon layer 34 is approximately 500 Å, such a high selective etching ratio as required in the above GOLD process is not needed with respect to the gate insulating layer 33 as an etch-stop.

More specifically, if a conventional gate electrode of approximately 3500 Å in thickness is patterned, it is normally necessary to overetch approximately 30% in consideration of the distribution of the layer thickness of the gate electrode on the silicon wafer and the entire removal of the electrode material remaining in a step of a LOCOS field insulating layer. In such case, the thickness of the gate electrode lost through the overetching is 1050 Å. In order to limit the etching loss of the gate insulating layer having a thickness of 80 Å to ½, that is, to 40 Å, the selective ratio must be more than 26. On the other hand, according to the present invention, it is only necessary to etch the polysilicon layer 34 500 Å in thickness, yielding a selective etch ratio of $26 \times (500/3500) = 4$.

As set forth by the present invention, an inverse-T gate electrode having a top composed of the polysilicon layer 34 and a leg composed of the polysilicon layer 37 is formed. Then, n-type impurities are doped by ion implantation into the silicon wafer 31, wherein the polysilicon layer 37 and the side wall layer 41 are used as masks, so that a n$^+$ source 42 and n$^+$ drain 43 are formed according to the dose of, for example, As ions $4 \times 10^{15}$ cm$^{-2}$ and the accelerating energy 60 KeV. Thereafter, an interlayer insulating layer, an upper wiring layer and so on are the layered. As a result, an IGFET having the LDD composed of n$^-$ source 39 and n$^-$ drain 40 and the inverse-T gate is completed.

In the process described with reference to FIG. 15, if the side wall layer 44 is made of $SiO_2$ instead of PSG, it is possible to leave the side wall layers 44 when masking layer 35 is removed. It therefore becomes unnecessary to form the side wall layer 41 in the process described with reference to FIG. 17. However, in such case, it is necessary to form a LDD by implanting ions into the silicon wafer 31 in the diagonal direction at the incident angle of, for example, 30° after the process of removing the masking layer 35. Well-known DDD (double diffused drain) method can be used instead of the diagonal ion implantation, wherein the masking layer 35 is removed, and the silicon wafer 31 is provided with a low dose of phosphorous (P) ions and a high dose of arsenic (As) ions by using the polysilicon layer 37 and the side wall 41 as masks. Then, the silicon wafer 31 is subject to a heating process. Thus, n$^-$ regions 39 and 40, and, n$^+$ regions 42 and 43 are formed in accordance with the difference in the diffusion speeds of P impurities and As impurities in the silicon wafer 31.

Figure 18:
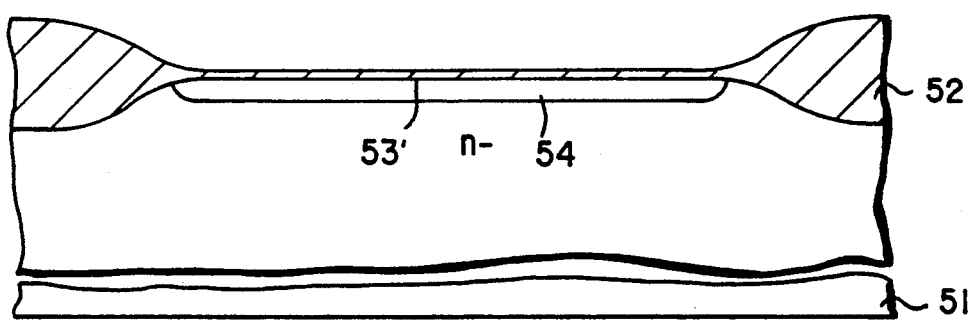
FIGS. 18 to 21 are sectional views of a main part of an IGFET having the inverse-T gate according to a second embodiment of the present invention.

A second embodiment according to the present invention will now be described below. Referring to FIG. 18, one surface of a p-type silicon wafer 51 is locally and thermally oxidized by the known LOCOS method using an oxidation-resistant mask made of, for example, a silicon nitride film so that forming a field insulating layer 52. After the removing the oxidation-resistant mask, the surface of the silicon wafer 51 outside of the field insulating layer 52 is thermally oxidized and an insulating layer 53' of, for example, approximately 300 Å in thickness is formed. After that, n-type impurities are doped by ion implantation into the silicon wafer 51, exposed in the device region, and delimited by the field insulating layer 52, so that a n− region 54 is formed. This implantation requires a dose of, for example, As ions $5 \times 10^{12}$ cm$^{-2}$ and the accelerating energy thereof of 60 KeV.

Figure 19:
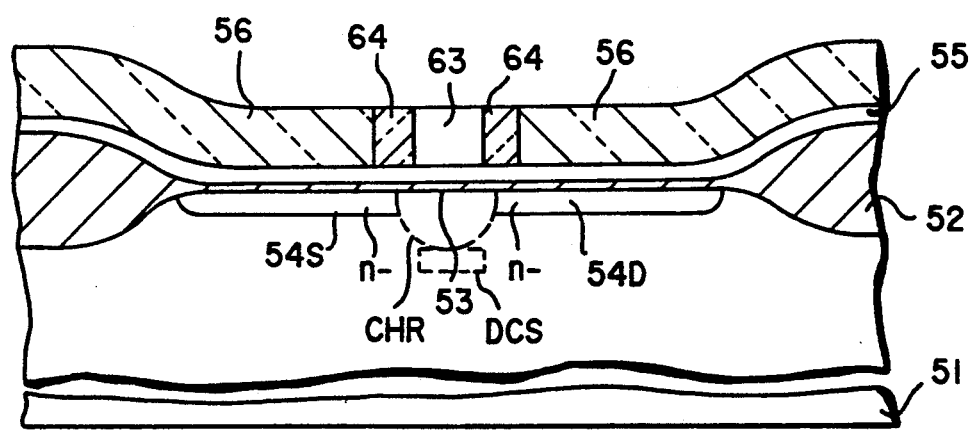

Subsequently, after removing the insulating layer 53', the surface of the silicon wafer 51 is thermally oxidized. Then, a gate insulating layer 53 of approximately 80 Å in thickness is formed as shown in FIG. 19, and, for example, a polysilicon layer 55 of approximately 500 Å in thickness and a masking layer 56 made of PSG of approximately 3000 Å in thickness are layered on the gate insulating layer 53 sequentially. Impurities are then doped into the polysilicon layer 55 during or after its growth. The polysilicon layer 55 may be replaced with a layer made of a refractory metal or a compound thereof.

An opening 63 is formed in the masking layer 56 and the side wall layer 64 made of, for example, PSG is formed on the the side of the masking layer 56, exposed in the opening 63. The opening 63 is formed by utilizing well-known lithography technology and a RIE method using an etchant composed of a mixed gas of CF$_4$ and CHF$_3$. The side wall layer 64 is formed by deposition and etch-backing of a PSG layer according to the same manner as in the above embodiment.

Then, p-type ions are doped by ion implantation into the silicon wafer 51 through the polysilicon layer 55 by using the masking layer 56 and the side wall layer 64 as masks. The implantation utilizes a dose of, for example, boron (B) ions of $8 \times 10^{12}$ to $3 \times 10^{13}$ cm$^{-2}$, the accelerating energy thereof 80 KeV. This dose compensates for the n-type impurities in the n− region 54. Therefore, a p-type channel region CHR is formed, and a n− source 54S and n− drain 54D are delimited in contact with the channel region CHR. Furthermore, it is possible to form a p-type channel cut region DCS by doping p-type impurities deeper by ion implantation, according to requirements.

In the present invention, the p-type channel region CHR and the channel cut region DCS are formed corresponding to the position of a gate electrode in a self-aligned fashion; the precision of the mutual alignment of these regions is remarkably enhanced compared with the case in which these regions are formed by using separate masks. Conventionally, when a channel region CHR or a channel cut region DCS is formed in the same manner as above, the surface of a silicon wafer which is exposed in a mask is covered with only a gate oxide film and greatly damaged by ions bombarding thereon during the compensation implantation. On the contrary, according to the present invention, since the silicon wafer 51 is covered with the polysilicon layer 55, damage of the silicon wafer 51 due to ion bombardment is minimal.

Figure 20:
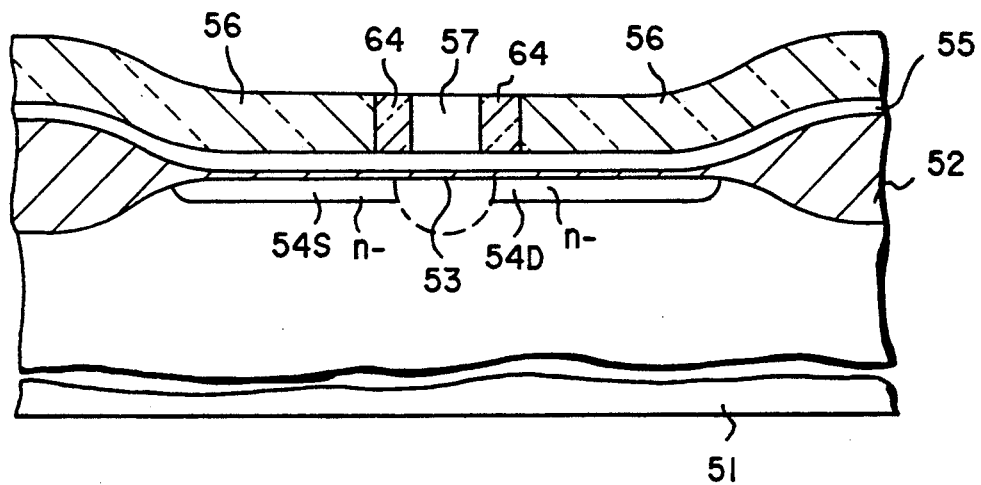

Subsequently, for example, a polysilicon layer 57 is embedded into the opening 63 as shown in FIG. 20. The formation of the polysilicon layer 57 may be done by etch-backing polysilicon deposited on the silicon wafer 51, or by selectively growing polysilicon on the polysilicon layer 55 exposed in the opening 63, in the same manner as in the above embodiment. Furthermore, impurities are doped into the polysilicon layer 57 during or after the growth thereof and the polysilicon layer 57 may be replaced with a layer made of a refractory metal or a compound thereof as in the above embodiment.

Figure 21:
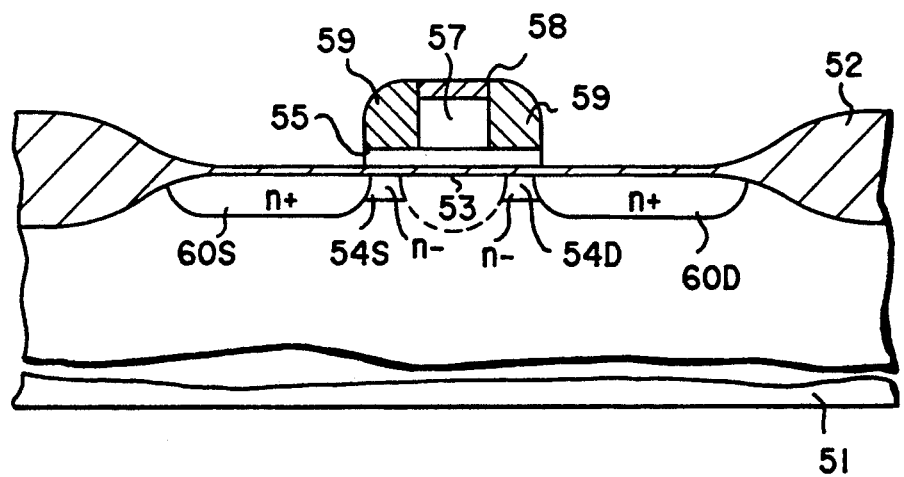

After an insulating layer 58 of approximately 1500 Å in thickness is formed on the polysilicon layer 57 by, for example, thermal oxidation as shown in FIG. 21, the masking layer 56 and the side wall layer 64 are removed. These layers 56 and 64 (made of PSG) may be removed by wet etching using hydrofluoric acid (HF) solution. Then, a side wall layer 59 made of, for example, SiO$_2$ are formed on the sides of the polysilicon layer 57. The formation of the side wall layer 59 is done by a well-known method that deposits SiO$_2$ of approximately 2000 Å in thickness on the polysilicon layer 55 and etch-backs of the SiO$_2$ by using an etchant composed of a mixed gas of CF$_4$ and CHF$_3$ as in the above embodiment.

Subsequently, the exposed polysilicon layer 55 is patterned by using the insulating layer 58 and the side wall layer 59 as masks. Thus, an inverse-T gate electrode having a top composed of the polysilicon layer 55 and a leg composed of the polysilicon layer 57 is formed. After that, n-type impurities are doped by ion implantation into the exposed device region by using the polysilicon layer 57 and the side wall layer 59 as masks, so that a n+ source 60S and n+ drain 60D are formed. This implantation requires a dose of, for example, As ions of $4 \times 10^{14}$ cm$^{-2}$ and an accelerating energy thereof 60 KeV.

An interlayer insulating layer with an upper wiring layer thereon is then formed, thereby completing an IGFET having a LDD composed of the n− regions 54S and 54D, and the inverse-T gate.

The following modifications may be applied to the above embodiment described with reference to FIGS. 18 to 21:

(a) omitting the side wall layer 64 from all processes relevant thereto;

(b) forming the side wall layer 64 made of SiO$_2$ so that the side wall layer 64 can be left in the process for removing the masking layer 56; or (c) forming the side wall layer 64 of SiO$_2$ as above (b), and omitting the side wall layer 59 from all processes relevant thereto.

Figure 22A:
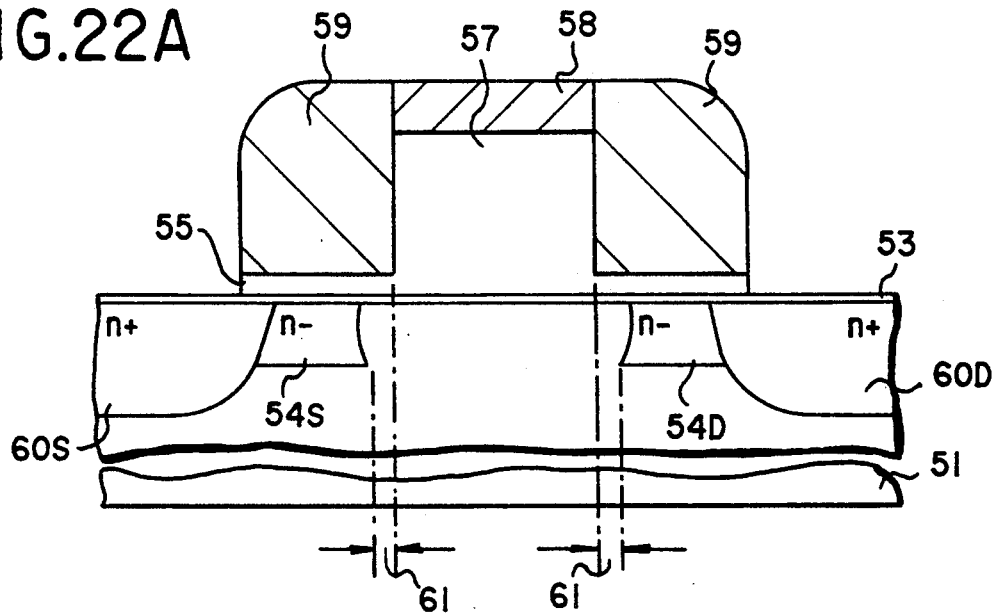
FIG. 22 is a sectional view explaining the increase in the effective channel length of the IGFET according to the present invention in comparison with that according to the prior art.
Figure 22B:
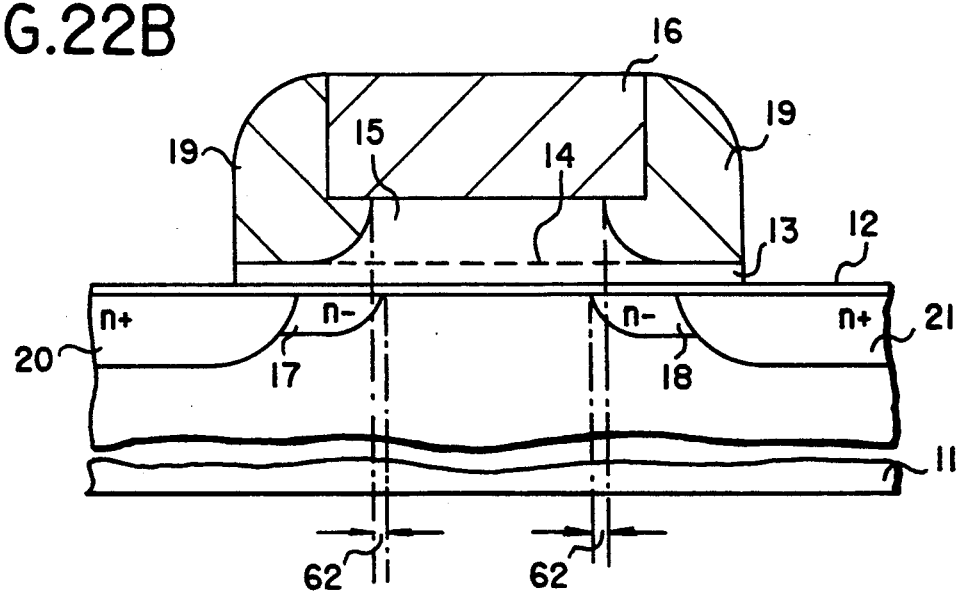

FIG. 22 is a sectional view showing an increase in the effective channel length attained according to the present invention, (in comparison with that of a conventional IGFET having inverse-T gate.) FIG. 22A shows the IGFET according to the second embodiment of the present invention explained with reference to FIGS. 18 to 21, and FIG. 22B shows a conventional IGFET described with reference to FIGS. 7 to 10. In the present invention, the n− source region 54S and n− drain region 54D retreat due to doping the above p-type impurities. Accordingly, the effective channel length is increased (denoted by numeral 61 as shown in FIG. 22A.) On the contrary, according to the prior art method, the effective channel length is decrease (denoted by numeral 62 due to the diffusion of the impurities in the n− source region 17 and the n− drain region 18 as shown in FIG. 22B.) Therefore, the present invention is advantageous in that it reduces the so called short channel effect.

Although the source and drain regions each contain a LDD in the above embodiments, it is needless to say that the present invention is also effective on a structure where a LDD is disposed in only the drain region. Furthermore, impurities for forming the LDD are not limited to As. It is apparent that the present invention is applicable to forming an IGFET having an inverse-T gate on a semiconductor substrate other than a silicon wafer, especially, a semiconductor substrate having what is called a SOI structure with islands of silicon or a semiconductor other than silicon, which are separately formed on an insulating layer. Still further, it is preferable that a first conductive layer comprising a top of the inverse-T gate be made of amorphous silicon instead of polysilicon. This is due to the fact that the channeling probability of doped ions in amorphous silicon is lower than that in the polysilicon. Therefore, amorphous silicon is more advantageous for forming a $n^-$ region of even depth.

What is claimed is:

1. A method of producing a FET with an inverse-T gate on a semiconductor substrate, comprising the steps of:

doping first conductivity type impurities of a first density into a device region delimited on one surface of a semiconductor substrate;

forming a gate insulating layer, a first conductive layer, and a masking layer which can be selectively etched with respect to said gate insulating layer on said semiconductor substrate wherein said first conductivity type impurities have been doped;

forming an opening in said masking layer to expose said first conductive layer in predetermined region delimited in said device region;

forming a side wall layer comprising an insulating material on a side of said masking layer exposed in said opening;

doping second conductivity type impurities having a second density capable of compensating for said first density of said first conductivity type impurities into said semiconductor substrate by using said masking layer as a mask, said masking layer having said side wall layer in said opening;

forming a second conductive layer for selectively filling said opening therewith and in contact with said first conductive layer on said semiconductor substrate into which said second conductivity type impurities have been doped;

removing at least said masking layer from said semiconductor substrate on which said second conductive layer has been formed; and selectively removing said first conductive layer, exposed by removing said masking layer, by using at lest said second conductive layer as a mask, whereby said inverse-T gate electrode is formed having a leg comprising said second conductive layer and a top comprising said first conductive layer.

2. A method according to claim 1, wherein said second conductive layer is formed by (a) depositing a conductive layer to bury said opening therewith over all of said semiconductor substrate having said masking layer with said side wall layer formed in said opening, and (b) etch-backing said conductive layer.

3. A method according to claim 1, wherein said masking layer is formed using thermal resistant insulating material and said second conductive layer is selectively grown on said first conductive layer exposed in said opening.

4. A method according to claim 1, further comprising the step of doping said first conductivity type impurities having a higher density than said first density into said semiconductor substrate by using said second conductive layer and said side wall layer as masks after removing said masking layer, whereby said FET has a LDD structure.

5. A method of producing a FET with an inverse-T gate on a semiconductor substrate, comprising the steps of:

doping first conductivity type impurities on a first density into a device region delimited on one surface of a semiconductor substrate;

forming a gate insulating layer, a first conductive layer, and a masking layer which can be selectively etched with respect to said gate insulating layer on said semiconductor substrate wherein said first conductivity type impurities have been doped, said first conductive layer being formed or amorphous silicon;

forming an opening in said masking layer to expose said first conductive layer in predetermined region delimited in said device region;

forming a side wall layer comprising an insulating material on a side of said masking layer exposed in said opening;

doping second conductivity type impurities having a second density capable of compensating for said first density of said first conductivity type impurities into said semiconductor substrate by using said masking layer as a mask, said masking layer having said side wall layer in said opening;

forming a second conductive layer for selectively filling said opening therewith and in contact with said first conductive layer on said semiconductor substrate into which said second conductivity type impurities have been doped;

removing at least said masking layer from said semiconductor substrate on which said second conductive layer has been formed; and selectively removing said first conductive layer, exposed by removing said masking layer, by using at lest said second conductive layer as a mask, whereby said inverse-T gate electrode is formed having a leg comprising said second conductive layer and a top comprising said first conductive layer.

6. A method according to claim 5, wherein said second conductive layer is formed by (a) depositing a conductive layer to bury said opening therewith over all of said semiconductor substrate having said masking layer with said side wall layer formed in said opening, and (b) etch-backing said conductive layer.

7. A method according to claim 5, further comprising the step of doping said first conductivity type impurities having a higher density than said first density into said semiconductor substrate by using said second conductive layer and said side wall layer as masks after removing said masking layer, whereby said FET has a LDD structure.

* * * * *